US007930127B2

(12) United States Patent
Lory et al.

(10) Patent No.: US 7,930,127 B2
(45) Date of Patent: Apr. 19, 2011

(54) OSCILLATOR PRESCALE CALIBRATION FOR HARMONIZING MULTIPLE DEVICES WITH INDEPENDENT OSCILLATORS OVER AN I²C BUS INTERFACE

(75) Inventors: Jay Richard Lory, Chandler, AZ (US); Alma Stephenson Anderson, Chandler, AZ (US)

(73) Assignee: NXP B.V., Eindhoven (NL)

( * ) Notice: Subject to any disclaimer, the term of this patent is extended or adjusted under 35 U.S.C. 154(b) by 191 days.

(21) Appl. No.: 12/269,018

(22) Filed: Nov. 11, 2008

(65) Prior Publication Data
US 2010/0117691 A1  May 13, 2010

(51) Int. Cl.
*G06F 13/00* (2006.01)
*G06F 13/42* (2006.01)
(52) U.S. Cl. ............. 702/106; 702/75; 702/78; 702/79; 710/110
(58) Field of Classification Search .............. 702/106, 702/75, 78, 79
See application file for complete search history.

(56) References Cited

U.S. PATENT DOCUMENTS

| 6,282,673 | B1* | 8/2001 | Liu et al. ................... 714/25 |
| 6,704,770 | B1 | 3/2004 | Ramakesavan ............ 709/205 |
| 6,799,233 | B1* | 9/2004 | Deshpande et al. ........ 710/110 |
| 7,349,512 | B2 | 3/2008 | Rausch et al. |
| 7,606,956 | B2* | 10/2009 | Deshpande et al. ........ 710/110 |
| 2004/0225813 | A1* | 11/2004 | Ervin ......................... 710/305 |
| 2005/0281367 | A1 | 12/2005 | Lesso |
| 2007/0156936 | A1 | 7/2007 | Boecker et al. |

FOREIGN PATENT DOCUMENTS

| EP | 1 280 024 A1 | 1/2003 |
| GB | 2 409 383 A | 6/2005 |
| WO | 03/013051 A2 | 2/2003 |
| WO | 2006/029511 A1 | 3/2006 |
| WO | WO 2008031234 A1 * | 3/2008 |

OTHER PUBLICATIONS

Written Opinion and International Search Report for international patent appln. No. PCT/IB2009/054950 (May 5, 2010), 19 pages.

* cited by examiner

*Primary Examiner* — Hal D Wachsman

(57) ABSTRACT

A system and method for synchronizing otherwise independent oscillators private to I²C Bus slave devices. An I²C Bus master device is capable of issuing two new general call commands, MEASURE PULSE and RESET PRESCALE. The I²C Bus slave devices respond to the MEASURE PULSE command by returning a digital count related to the number of ticks its local, private oscillator cycles through during a signal pulse on the I²C Bus. All such I²C Bus slave devices measure the same signal pulse on the I²C Bus, so the differences in the digital measurements returned during the MEASURE PULSE command are proportional to their respective oscillator frequencies. The various digital measurements returned are used to calculate appropriate oscillator prescale factors that will harmonize the final product frequencies of all of the local oscillators on all of the I²C Bus slave devices in the system.

20 Claims, 8 Drawing Sheets

| S | A6 | A5 | A4 | A3 | A2 | A1 | A0 | R/$\overline{W}$ | A | D7 | D6 | D5 | D4 | D3 | D2 | D1 | D0 | A | P |
|---|----|----|----|----|----|----|----|------|---|----|----|----|----|----|----|----|----|---|---|
|   | 0  | 0  | 0  | 0  | 0  | 0  | 0  | 0    | A | 0  | 0  | 0  | 0  | 1  | 1  | 0  | 0  | A |   |
| | GENERAL CALL (WRITE) | | | | | | | | | RESET PRESCALE COMMAND | | | | | | | | | |

FIG. 5

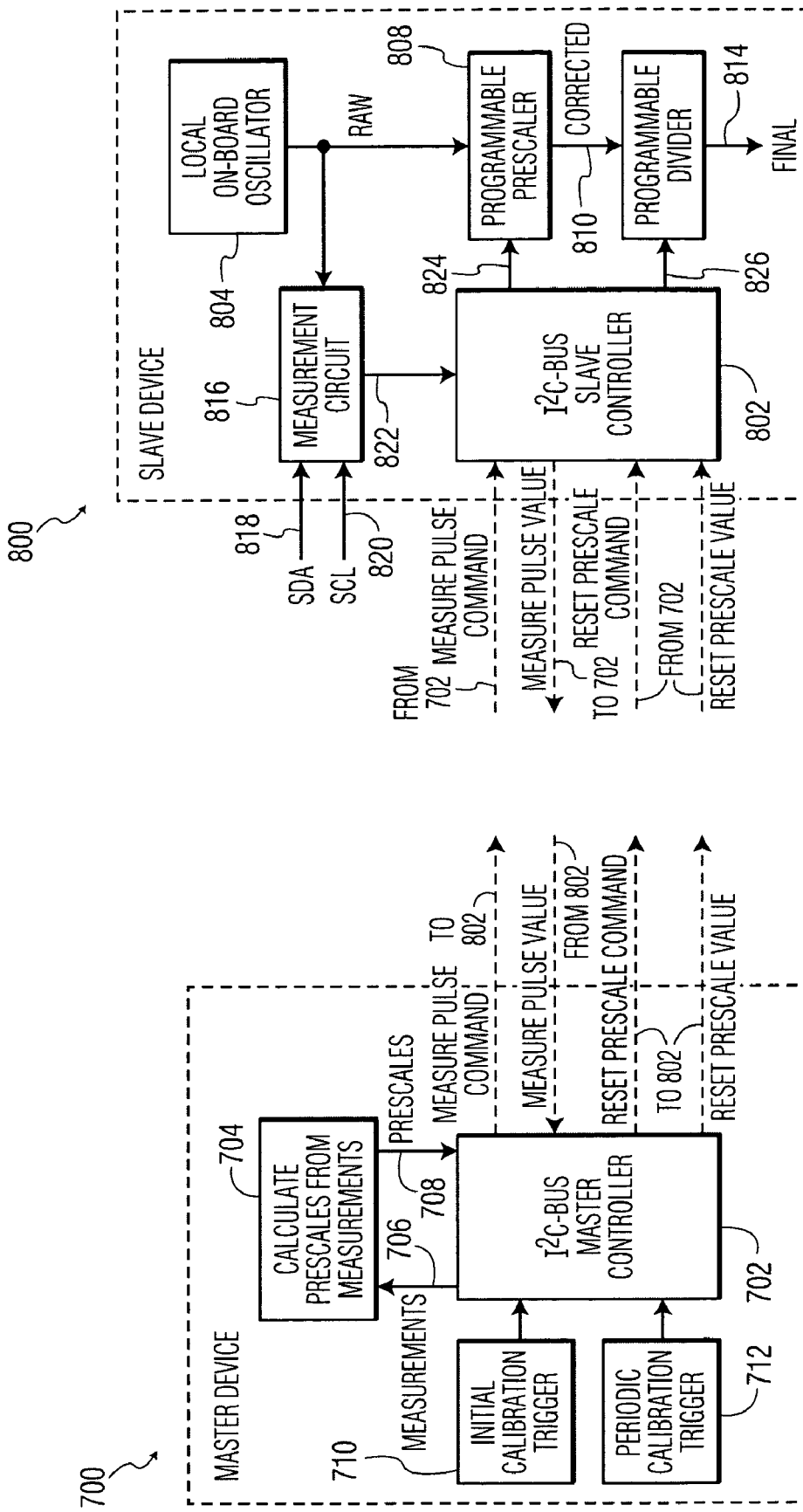

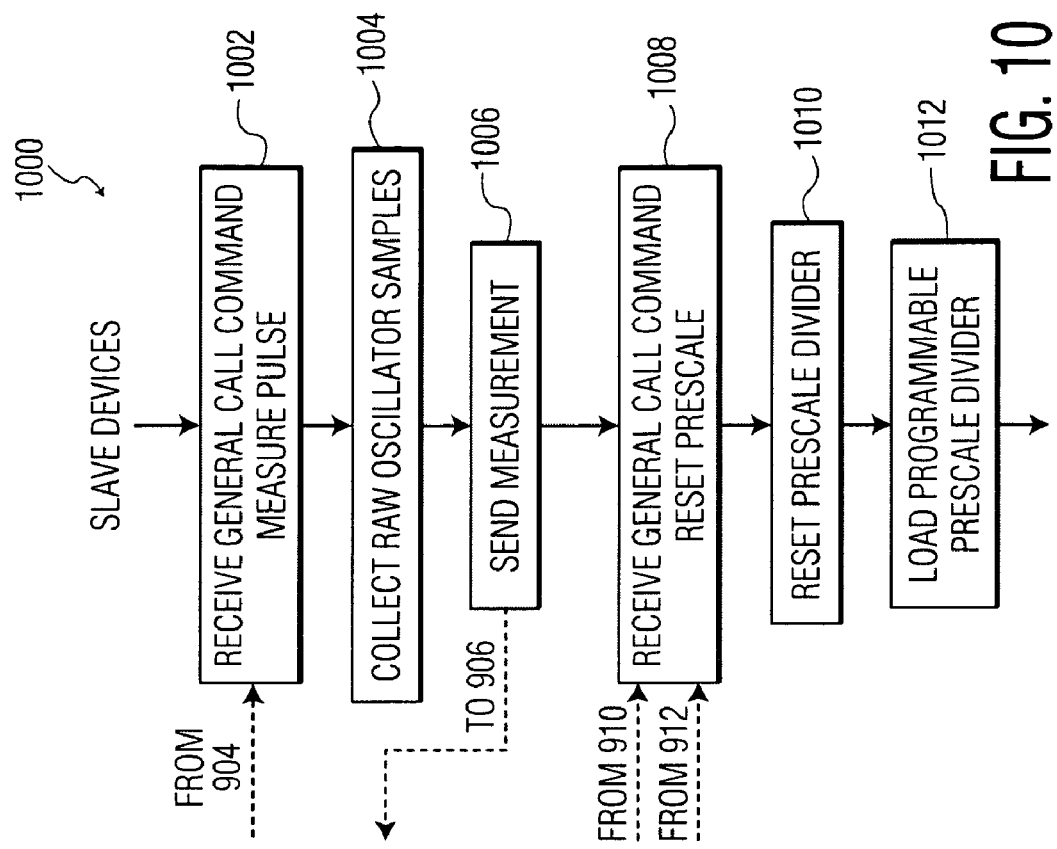
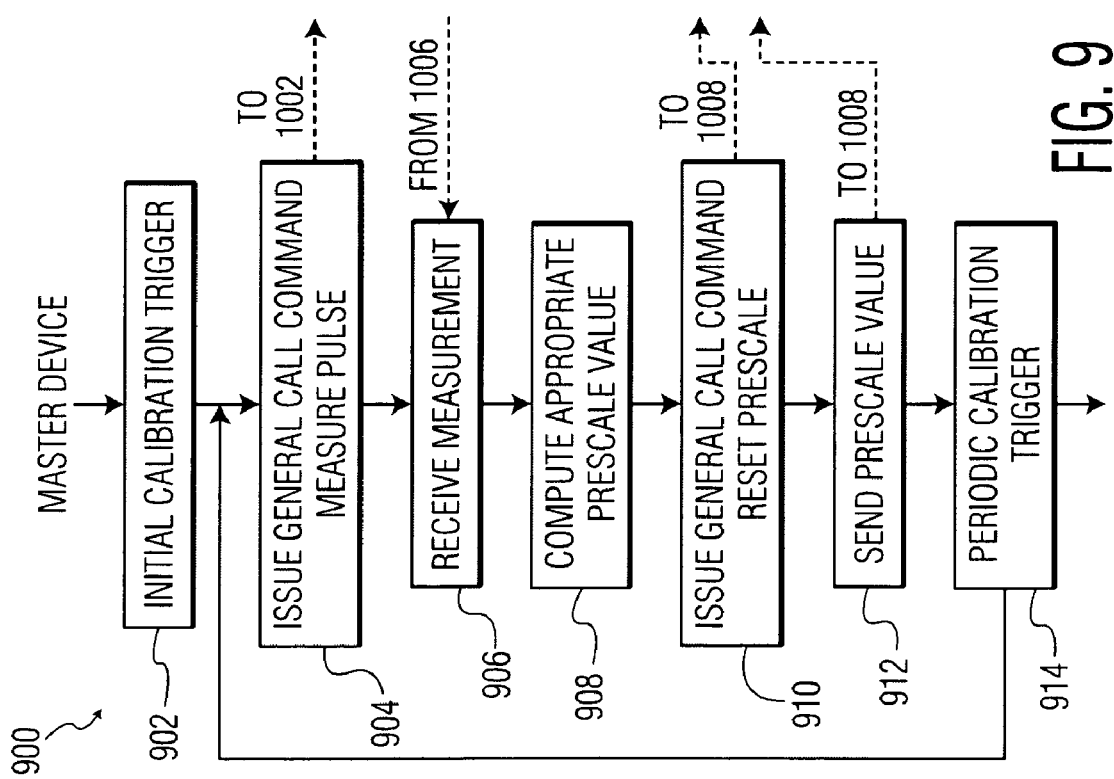
FIG. 10
FIG. 9

OSCILLATOR PRESCALE CALIBRATION FOR HARMONIZING MULTIPLE DEVICES WITH INDEPENDENT OSCILLATORS OVER AN I²C BUS INTERFACE

The invention relates generally to methods and devices for harmonizing the independent oscillators on slave devices in industry-standard inter-integrated circuit (I²C) Bus applications, and more particularly to using I²C Bus commands and signals to determine an individual device's oscillator frequency, to calculate an appropriate oscillator prescale factor, and to write the new prescale factor back into the device.

LED devices are now being widely used to replace conventional lamps in vehicle turn signals and taillights, advertizing signs, cellphones, etc. Sometimes many individual LED devices are used to replace a single incandescent lamp in applications that require blinking, dimming, or on-off operation. That job often falls on LED drivers that are controlled by signals on I²C Buses. One example of a conventional device is the NXP PCA963x series of blinkers.

In conventional LED blinking applications, getting all of the LEDs to dim or blink on-off together at the same instant has been troublesome. Many I²C devices include their own oscillators followed by fixed prescalers and programmable dividers for timing functions. Having an on-board oscillator can reduce the traffic on the I²C Bus by eliminating the need to explicitly command every on-off operation by a master device to a slave device. An exemplary prior art device has a 25-MHz oscillator, with a ±30% frequency variability, followed by a programmable prescaler that defaults to a divide-by-1024, and a fixed divide-by-two and a fixed divide-by-512 divider. The blink frequency, at a default prescale factor of 1024, is therefore 23.84 Hz. The output is used to control when an LED will actually blink on or off.

However, because the typical on-board oscillators are low-cost, low-power, and un-calibrated, they can have wide device-to-device frequency variations of up to ±40%. The device-to-device frequency variations are hard to control because they result from process, operating voltage, and temperature differences. So in side-by-side applications of the same I²C device, it is possible for a first device to have an oscillator that runs at 25.00 MHz, the second at 32.50 MHz, and the third at 17.50 MHz. So, sending the same I²C command to multiple LEDs to prescale each device by 1024 would result in blink frequencies of 23.84 Hz, 31.00 Hz, and 16.69 Hz, respectively. Those differences could cause problems that will be very visible to users watching the LEDs being controlled. Conventional I²C devices do not allow the consequential output frequencies to be readback, checked, or calibrated.

In a typical application, an equation for the Blink Rate resulting in the example would be, (N+1)/BlinkFrequency, where N is a factor that is programmed into a blink rate register that controls a timer. If a user wanted three LEDs to blink together at a 1.00 Hz rate, the ideal blink frequency would be 24.00 Hz, and the ideal oscillator frequency before prescaling would be 25.16582 MHz (24 Hz×512×2×1024). So N needs to be "23", and that factor would normally be loaded into a blink rate register using I²C commands. But because of the variability in the on-board oscillator frequencies, the actual blink rates for the three devices in the example would be: (23+1)/23.84 Hz=1.0067 seconds; (23+1)/31.00 Hz=0.7742 seconds; and, (23+1)/16.69 Hz=1.4380 seconds. The differences would be highly visible to the human eye.

One solution would be to eliminate the independent on-board oscillators and clock all of the I²C devices with one external system clock, but that would require putting an extra pin on each device. Adding pins to devices requires larger more complex packages, and that can make each device more expensive to produce. What is needed are solutions that do not require adding more pins to standard devices.

In an embodiment, standard I²C commands and signals are used to set an individual I²C device's oscillator frequency, to calculate a new prescale factor, and to write the necessary prescale factor back into the device.

A system, device, protocol, and method for on-demand prescale calibration across multiple devices with independent oscillators over an I²C Bus are described. New I²C general call commands MEASURE PULSE and RESET PRESCALE are included to be able to obtain a measurement from an oscillator in a number of slave devices, and for a master device to compute and load appropriate prescale factors for use in the oscillator prescaler of the corresponding slave devices. In one embodiment, the slave devices independently control individual LEDs that need to be blinked and dimmed in unison. Other embodiments of the system and method are also described.

Other aspects and advantages of the present invention will become apparent from the following detailed description, taken in conjunction with the accompanying drawings, illustrating by way of example the principles of the invention.

FIG. 5 illustrates a serial bit structure for the RESET PRESCALE general call command embodiment.

FIG. 7 illustrates a master device embodiment which can issue the MEASURE PULSE and RESET PRESCALE commands, and calculate an appropriate prescale factor for a group of slave devices.

FIG. 8 illustrates a slave device embodiment which can respond to the MEASURE PULSE and RESET PRESCALE commands, and is able to accept an appropriate prescale factor that was computed for it in particular.

FIG. 9 illustrates a flowchart for a method embodiment which can issue the MEASURE PULSE and RESET PRESCALE commands, and calculate an appropriate prescale factor for a group of slave devices.

FIG. 10 illustrates a flowchart for a method embodiment which can respond to the MEASURE PULSE and RESET PRESCALE commands, and is able to accept an appropriate prescale factor that was computed for a particular slave device.

Throughout the description, similar reference numbers may be used to identify similar elements.

Figure 1:
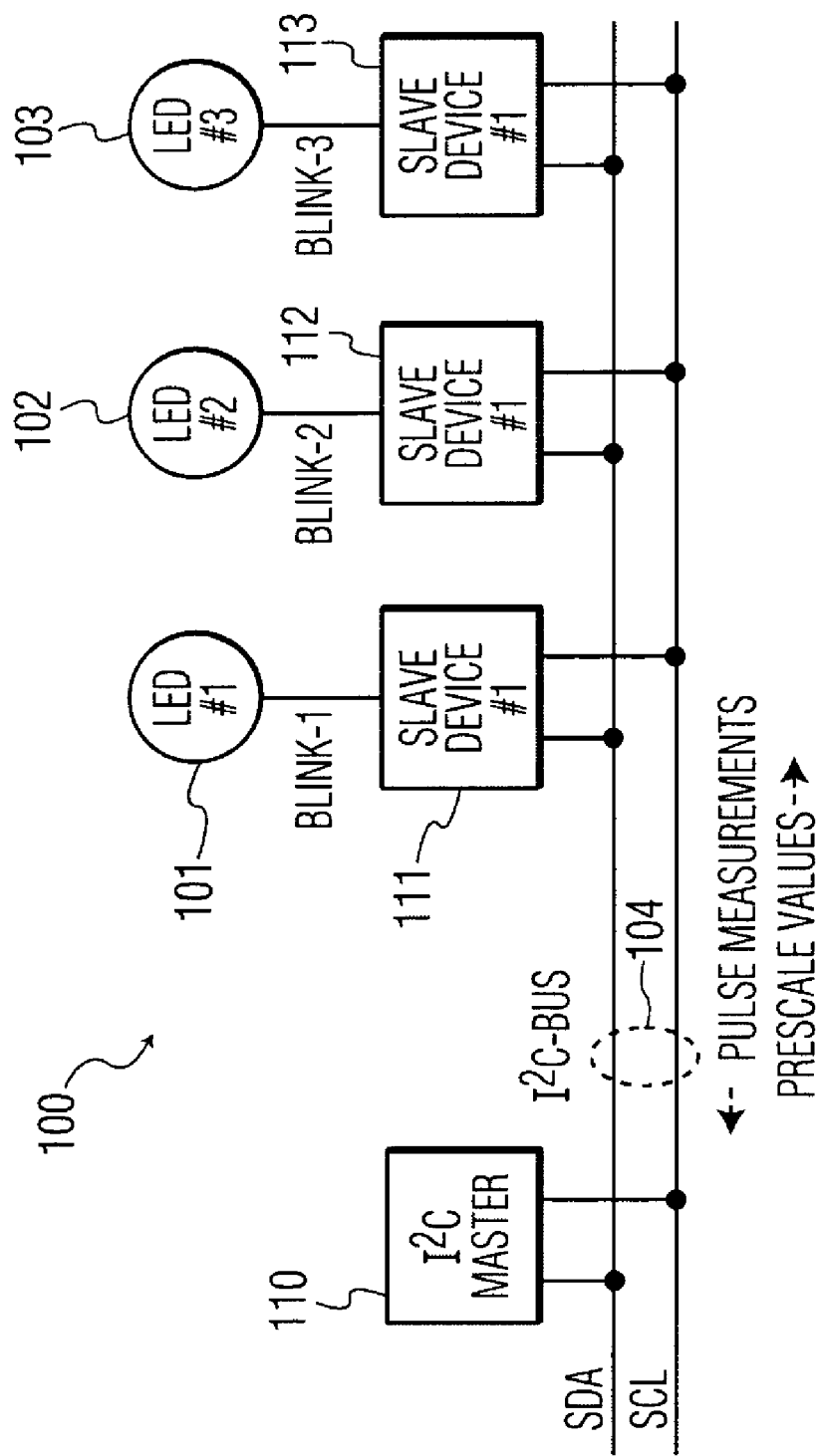
FIG. 1 illustrates an embodiment of an I²C system in which a master device and many slave devices are able to issue and respond to new I²C general call commands MEASURE PULSE and RESET PRESCALE.

In the following description, specific details of various embodiments are provided. However, some embodiments may be practiced with less than all of these specific details. In other instances, certain methods, procedures, components, structures, and/or functions are described in no more detail than is necessary to enable the various embodiments of the invention, e.g., for the sake of brevity and clarity.

While particular embodiments are described herein, there are no doubt many ways in digital hardware and computer software to accomplish the same ends. In all embodiments, the methods and circuits include reading a test count of the number of frequency ticks that a slave device's on-board oscillator produces during a standard pulse width observable by all slave devices and master devices on an I²C Bus. Then computing and loading an appropriate prescale factor to use on each respective on-board oscillator that will harmonize and coordinate them all. Some embodiments use I²C general call commands to effectuate the measurement, calculating, and loading. Other embodiments could use different methods of command. Still further embodiments may need to harmonize and coordinate their on-board local oscillator frequencies to blink or dim LEDs in unison, and alternative embodiments do it for purposes particular to their applications that have nothing at all to do with LEDs.

The I²C Bus uses bi-directional serial clock (SCL) and a serial data (SDA) lines to communicate in half-duplex mode on two wires and a ground. Four transfer rates are possible: standard, 100 kbps [bits per second]; fast, 400 kbps; high speed, fast plus, 1 Mbps; and 3.4 Mbps. The I²C Bus interface uses 8-bit long bytes, and each device has a unique address. Any device may be a transmitter or receiver, and a master device or slave device. Herein, calling a particular device a slave device or a master device is only a temporary label to help better describe which device at any one instant is controlling another device.

Data and clock are sent from a Bus master device, and the data is valid while the clock line is high. The link may have multiple master devices and slave devices on the bus, but only one master device is allowed to control the I²C Bus at any one time. Slaves may receive or transmit data to the master device. Operating power voltages, $V_{DD}$, may be different for each device, and all devices use pull-up resistors on open-drain outputs to the I²C Bus.

Before any transaction can proceed on the I²C Bus, a START condition must be issued. The device issuing the START condition pulls the SDA data line (data) line low, and then pulls the SCL clock line (clock) line low. The START condition acts as a signal to every device that something is about to be transmitted on the bus. All devices connected listen to the bus to see if they are to be involved in the upcoming transaction.

After a message has been completed, a STOP condition is sent in which the Bus master device releases the SCL clock line and then releases the SDA data line. This is the signal for all devices on the bus that the bus is available for a new master device. Any device that received data during the last transaction can then begin processing it.

Once the START condition has been sent, a byte can be transmitted by the master device to the slave device. This first byte after a START condition will identify the slave device on the I²C Bus by its address, and will select a mode of operation. The meaning of the bytes that follow depend on the slave device. A number of addresses have been reserved for special purposes. One of the reserved addresses is used to switch to a 10-bit, Extended Addressing Mode. If a standard slave device that is not able to resolve extended addressing receives this address, it won't do anything (since it's not its address). If there are slave devices on the I²C Bus that can operate in the extended 10-bit addressing mode, they will all respond to the ACK cycle issued by the master device. The second byte that gets transmitted by the master device will then be taken in and evaluated against their address.

When addresses or data bytes have been transmitted onto the I²C Bus, they must be ACKNOWLEDGED by a slave device. A slave device can respond to the address with an ACK only if the address matches. When a data byte is transmitted to an already addressed slave device, then that slave device will be the one to respond with an ACK. The ACK consists of pulling the SDA data line low immediately after reception of the eighth bit transmitted. Or, in case of an address byte, immediately after the evaluation of its address. As soon as a master device pulls the SCL clock line low to complete the transmission of the bit, the SDA data line is pulled low by the slave device. The master device then issues a clock pulse on the SCL clock line. The slave device releases the SDA data line at the end of the clock pulse. The bus is then available for the master device to continue sending data or to generate a stop.

In a GENERAL CALL, all devices on the bus are addressed. If a device does not need the information provided, it simply issues a not-acknowledge. A second byte in the GENERAL CALL includes a special command. The conventional commands are described in the I²C Bus Specification, e.g., as published in June 2007 as Version 03 by NXP Semiconductors.

In one embodiment, the divide-by-1024 default used in a device's programmable prescale register is made programmable with an appropriate factor that is calculated to compensate for its oscillator's actual frequency. A target device's oscillator clock frequency must therefore be readable, e.g., over the I²C Bus, such as by using I²C Bus commands. Once the raw clock frequency is sampled, an I²C master device can calculate an appropriate prescale factor to correct it, and load the prescale factor into the target slave device's prescale register.

FIG. 1 illustrates a system 100 in which there are three LEDs 101-103 that need to seemingly blink in sync with one another. An I²C Bus 104 includes an SDA data line 106 and an SCL clock line 108. A master device 110 has control of the I²C Bus and is able to issue commands to slave devices 111-113. Embodiments are able to issue general call commands that order the slave devices to take frequency measurements of their respective oscillators, and then return the measurements to the master device 110. The master device 110 computes a prescale factor for each slave device 111-113, and commands the slave devices to accept these prescale factors.

Figure 2:
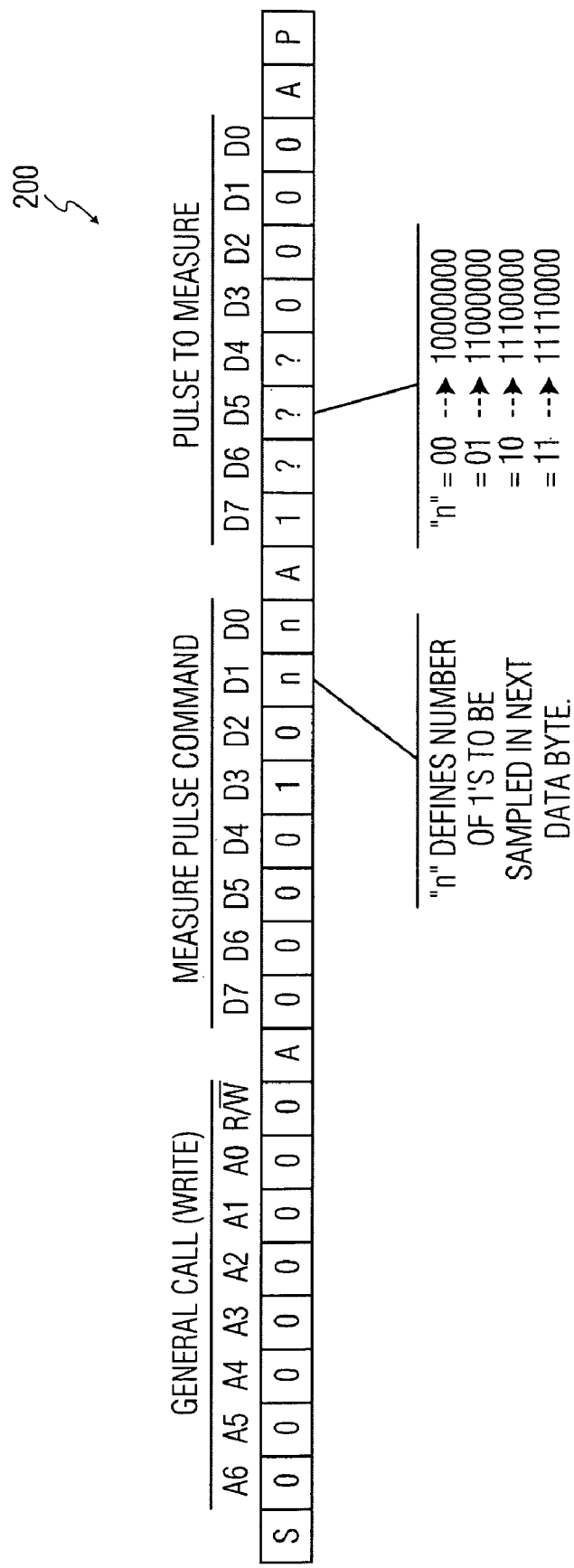
FIG. 2 illustrates a serial bit structure for the MEASURE PULSE general call command embodiment.

Embodiments therefore include two new I²C Bus GENERAL CALL commands. FIG. 2 illustrates a first command, e.g., a MEASURE PULSE command 200, and is shown in a bit-serial I²C data flow format. Two bits in the command, labeled n, define the number of 1's to be sampled in the next data byte. It is set based on the I²C Bus SCL clock line frequency. The start bit is labeled S, acknowledge is A, and stop is P.

Figure 3:
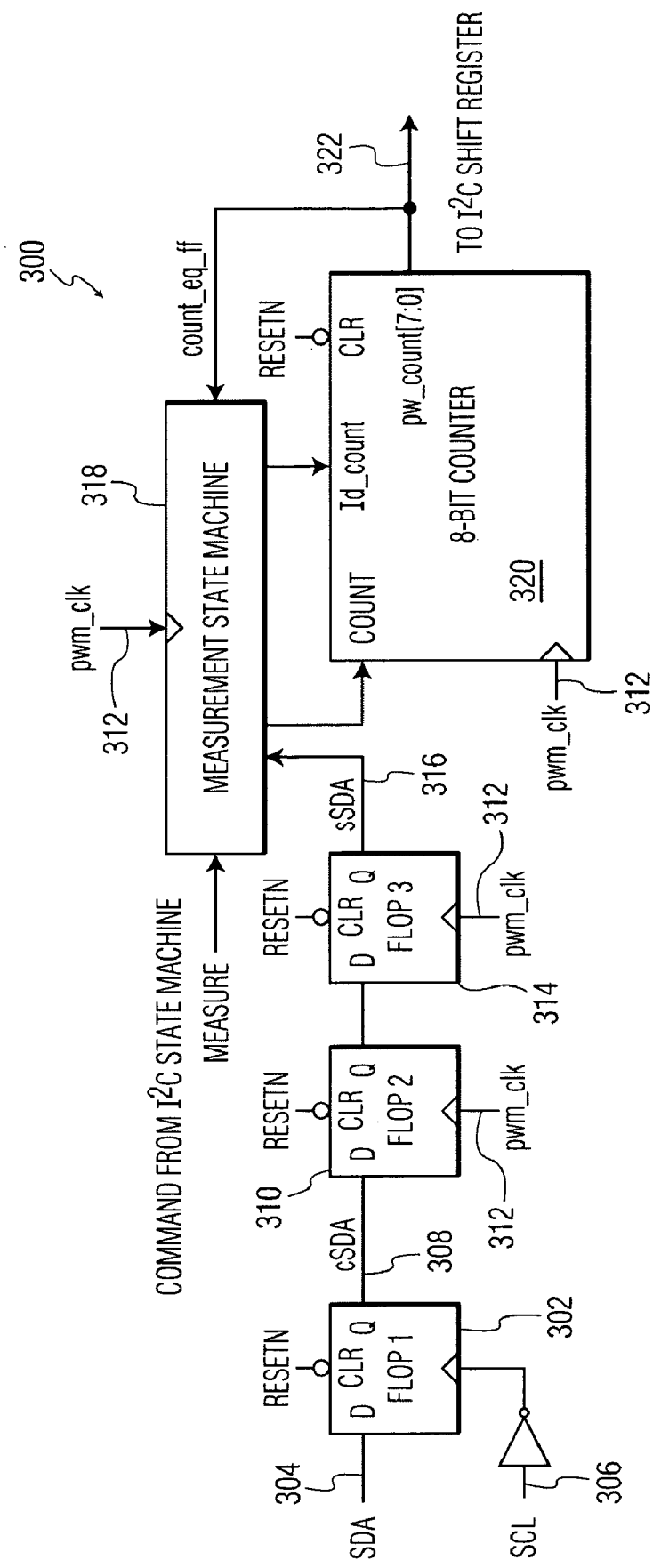
FIG. 3 illustrates a circuit for implementation in a slave device embodiment that can measure a corresponding on-board oscillator frequency.

FIG. 3 illustrates a circuit 300 that can be used on-board each slave device 111-113 to measure its private oscillator frequency. Circuit 300 does this indirectly by using a time base (pwm_clk) derived from the on-board oscillator to measure the width of the I²C Bus command data pulse observable on the SDA data line and SCL clock lines 106 and 108. Such command data pulse is visible to all I²C devices in parallel because they all connect to the same SDA data line and SCL clock line, and such serves here as a common reference by which to measure. Any on-board measurement differences can therefore be attributed 100% to the unique individual differences in each slave device's oscillator frequency.

A first flip-flop 302 has its D-input connected to the SDA data line 304 and is triggered by SCL clock line 306. The first flip-flop produces a "cSDA" signal 308 that is connected to the D-input of a second flip-flop 310. A "pwm_clk" signal 312 from the oscillator on-board the I²C device is used to trigger all of the other devices. Since the command data pulses observed on the SDA data line 304 and SCL clock line 306 will be the same for all devices on a particular I²C Bus, it is the frequency of the pwm_clk signal 312 that is really being measured by circuit 300. Flip-flops 310 and 314 are used to synchronize the cSDA signal 308 data into the pwm_clk domain, to arrive at an "sSDA" signal 316 for a measurement state machine 318. An 8-bit counter 320 is used to produce a digital measurement 322 for an I²C shift register that can be read by an I²C Bus master device. Counting is stopped in counter 320 if the count reaches 255 (FF hex), which is an overflow condition.

Figure 4:
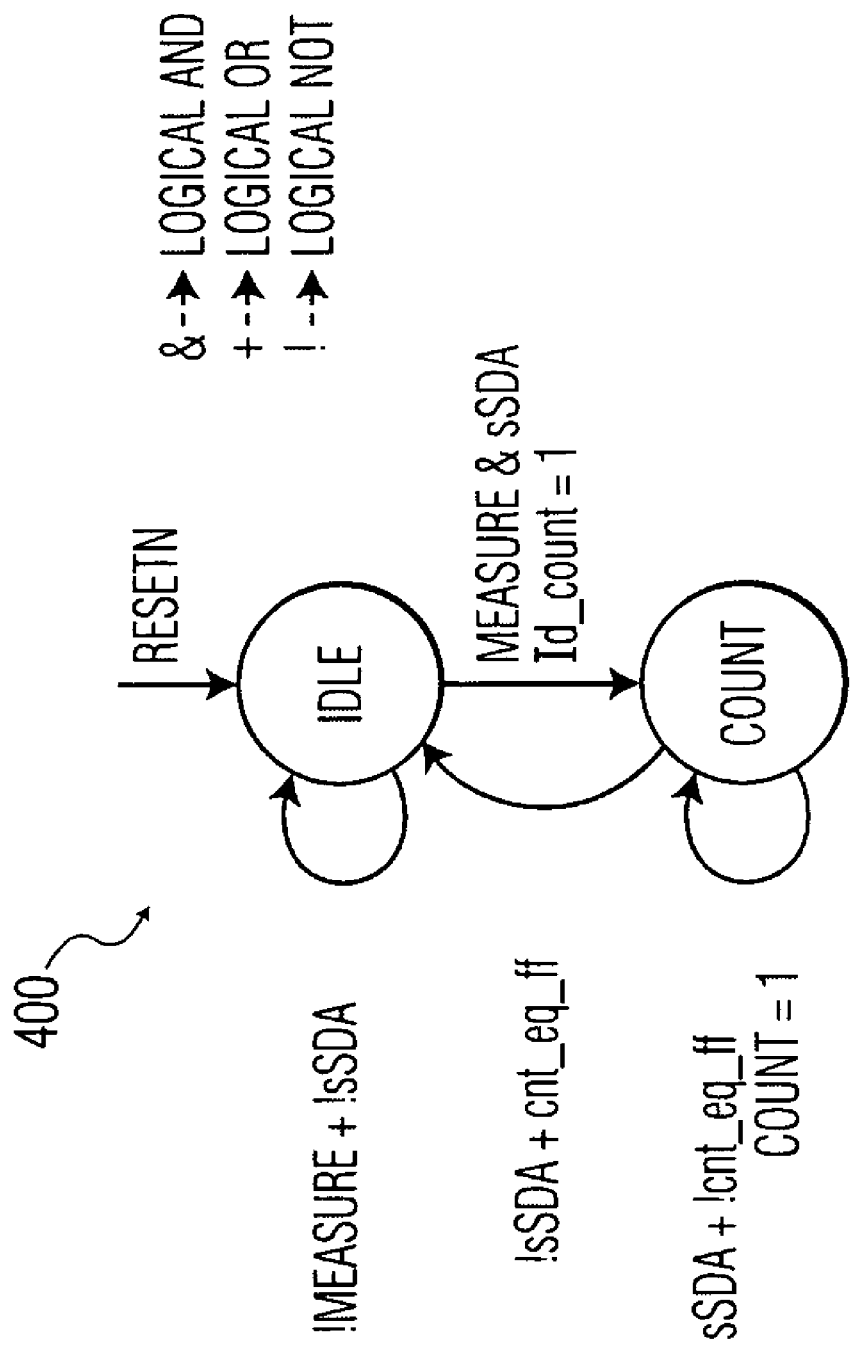
FIG. 4 illustrates a state machine logic useful in the measurement state machine of FIG. 3.

FIG. 4 illustrates the logic of a state machine 400 that can be included in the measurement state machine 318 of FIG. 3.

FIG. 5 illustrates the second of the new I²C Bus commands included in the embodiments, e.g., a RESET PRESCALE command 500. The first byte of the general call command is all zeroes, e.g., 00000000, indicating a write byte follows. The next byte is the 8-bit prescale factor to load into the prescale register in the slave device.

Figure 6:
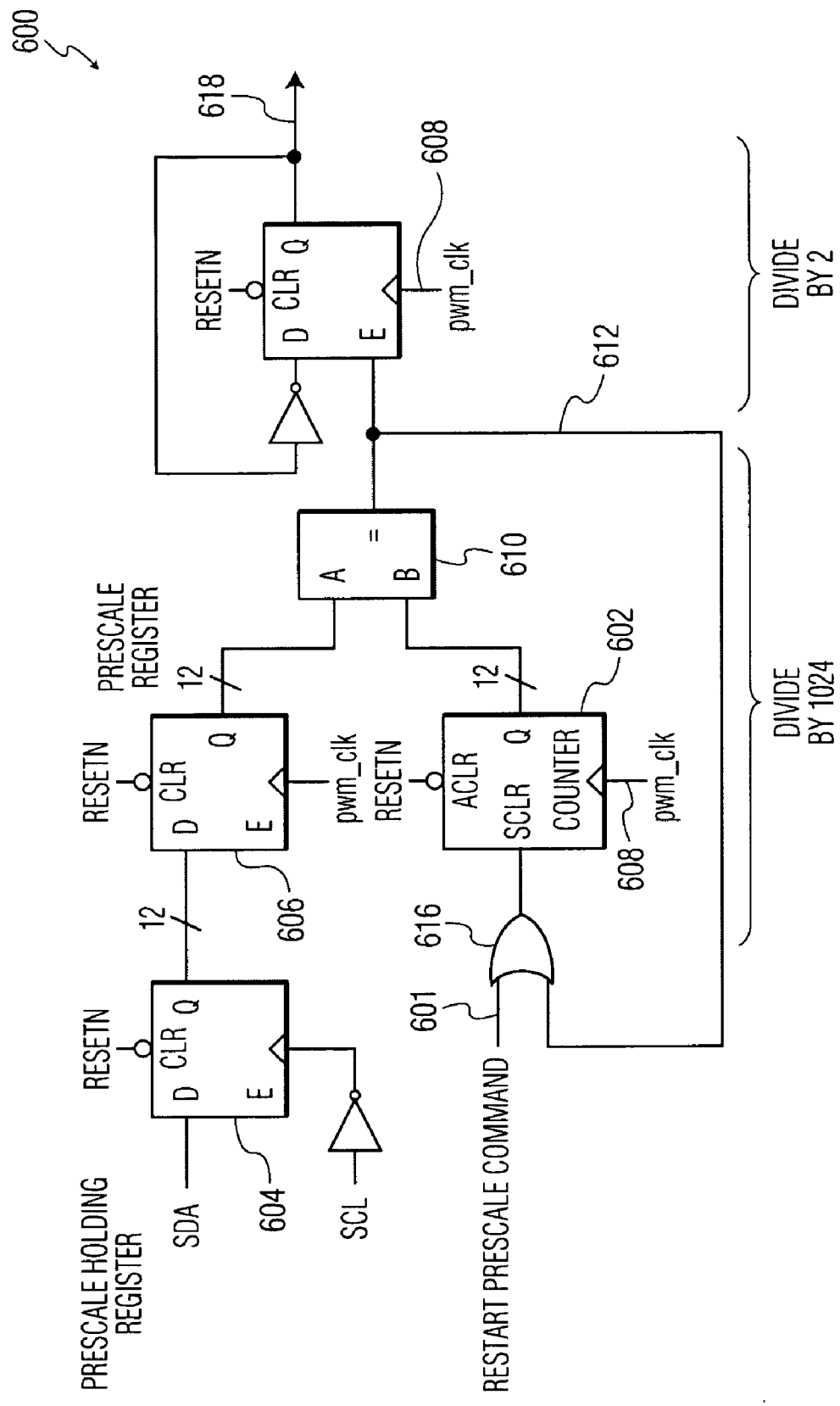
FIG. 6 illustrates a programmable prescale circuit for implementation in a slave device embodiment that can accept a prescale factor for a corresponding on-board oscillator.

FIG. 6 illustrates a prescaler 600 for inclusion in a slave device 111-113. The receipt of a RESET PRESCALE command 601 will restart a prescaler counter 602. A serial-in, parallel-out shift register 604 clocks in the 12-bits of the prescale factor from the I²C Bus that was sent by master device 110. A prescale register 606 loads in the 12-bit prescale factor in parallel and holds it for reference during divide-by-N operations. Counter 602 then proceeds to count upwards at its 12-bit parallel output with each tick pwm_clk from the local on-board oscillator. A 12-bit digital comparator 610 waits for the count from counter 602 to match the prescale factor from register 606. When they match, a pulse 612 is output that triggers divide-by-two flip-flop 614 and causes a restart of counter 602 through OR-gate 616. The final divide-by-N operation appears on output 618.

Table-I, Table-II, and Table-III, show some pulse measurement examples that can be applied, e.g., to system 100 in FIG. 1.

TABLE I

With the I²C Bus in Fast Mode Plus, and the SCL clock running at 1 MHz, the Pulse width is four clocks of SCL clock line (4 μS):

Measurement command ➔ 0000_1011 binary
slave device 111 measures 4 μS × 25.0 MHz ➔ count = 100
slave device 112 measures 4 μS × 32.5 MHz ➔ count = 130
slave device 113 measures 4 μS × 17.5 MHz ➔ count = 70

TABLE II

With the I²C Bus in Fast Mode, and the clock of the SCL clock line running at 400-KHz, the Pulse width is two clocks of the SCL clock line (5 μS):

Measurement command ➔ 0000_1001 binary
slave device 111 measures 5 μS × 25.0 MHz ➔ count = 125
slave device 112 measures 5 μS × 32.5 MHz ➔ count = 162.5, truncate to 162
slave device 113 measures 5 μS × 17.5 MHz ➔ count = 87.5, truncate to 87

TABLE III

For the I²C Bus in Standard Mode, and the clock of the SCL clock line running at 100-KHz, the Pulse width is one clock of the SCL clock line (10 μS):

Measurement command ➔ 0000_1000 binary
slave device 111 measures 10 μS × 25.0 MHz ➔ count = 250
slave device 112 measures 10 μS × 32.5 MHz ➔ count = 255 (overflow)
slave device 113 measures 10 μS × 17.5 MHz ➔ count = 175

As seen in Table-III, there is an overflow condition in slave device 112, so the choice of an SCL clock of 100-KHz will not work. The minimum SCL clock frequency is 254/32.5 MHz=7.82 μS, or 128-KHz. (Note, "254" is used in the above equation because "255" indicates an overflow condition.) If lower SCL clock frequencies than that are required, then the bit-width of the measurement counter must be greater than 8-bits. The I²C Bus 104 is an 8-bit bus, so adding to the width of the counter will require an extra read sequence to retrieve more bytes that describe the entire count.

An I²C Bus master device 110 can then read a measurement register in each slave device 111-113 using standard I²C Bus protocol. The oscillator frequency for each device can be calculated, as in Table-IV and Table-V, for example, using, Device oscillator frequency=((SCL clock frequency)/n)× measurement read, where n is the pulse width count. The I²C Bus in Standard Mode is not calculated.

TABLE IV

I²C Bus in Fast Mode Plus, SCL clock at 1.00-MHz, n = 4:

slave device 111 oscillator ➔ (1 MHz/4) × 100 = 25.0 MHz
slave device 112 oscillator ➔ (1 MHz/4) × 130 = 32.5 MHz
slave device 113 oscillator ➔ (1 MHz/4) × 70 = 17.5 MHz

TABLE V

I²C Bus in Fast Mode, SCL clock at 400-KHz, n = 2:

slave device 111 oscillator ➔ (400-KHz/2) × 125 = 25.0 MHz
slave device 112 oscillator ➔ (400-KHz/2) × 162 = 32.4 MHz
slave device 113 oscillator ➔ (400-KHz/2) × 87 = 17.4 MHz If the I²C Bus master device 110 knows the actual SCL clock frequency, it can use that frequency in its calculations. Ideally, the master device measures the time the actual pulse is high on the SDA data line. If an absolute measurement of the frequencies is unnecessary, as in applications where the blink rate is not critical but their blinking altogether synchronously is, then a virtual frequency can be assumed and the measurements and corrections will all have the same relative basis.

An appropriate device prescale factor is calculated. The nominal prescale divide is 1024, with 1023 being used in the equation below because of how the prescale is implemented in the examples.

The prescale factor is equal to the calculated device frequency divided by the nominal oscillator frequency, times 1023, and rounded, e.g., {(calculated device frequency)/(nominal oscillator frequency)}×1023.

Using a nominal oscillator frequency, in one example of 25.00-MHz, Table-VI and Table-VII show the calculations.

TABLE VI

I²C Bus in Fast Mode Plus, SCL clock at 1 MHz:

slave device 111 Prescale ➔ (25.0 MHz/25 MHz) × 1023 = 1023
slave device 112 Prescale ➔ (32.5 MHz/25 MHz) × 1023 = 1329.9 = 1330
slave device 113 Prescale ➔ (17.5 MHz/25 MHz) × 1023 = 716.1 = 716

TABLE VII

I²C Bus in Fast Mode, SCL clock at 400-KHz:

slave device 111 Prescale ➔ (25.0 MHz/25 MHz) × 1023 = 1023
slave device 112 Prescale ➔ (32.4 MHz/25 MHz) × 1023 = 1325.8 = 1326
slave device 113 Prescale ➔ (17.4 MHz/25 MHz) × 1023 = 712

The I²C Bus master device writes the calculated prescale factors into the prescale register using standard I²C protocol. The results are summarized in Table-VIII for an SCL clock of 1.00 MHz, and in Table-IX for an SCL clock of 400 Hz.

TABLE VIII

For the I²C Bus in Fast Mode Plus, SCL clock at 1.00 MHz:
    slave device 111 Blink Frequency: {(25.0 MHz/(1023 + 1))/2}/512 = 23.84185 Hz
    slave device 112 Blink Frequency: {(32.5 MHz/(1330 + 1))/2}/512 = 23.84544 Hz
    slave device 113 Blink Frequency: {(17.5 MHz/(716 + 1))/2}/512 = 23.83520 Hz
If the user wants all LEDs to blink at a 1.00 Hz rate, the new blink rates will actually be:
    slave device 111 Blink Rate: (23 + 1)/23.84185 Hz = 1.00663 seconds
    slave device 112 Blink Rate: (23 + 1)/23.84544 Hz = 1.00648 seconds
    slave device 113 Blink Rate: (23 + 1)/23.83520 Hz = 1.00691 seconds

TABLE IX

For I²C Bus in Fast Mode, SCL clock at 400 Hz:
    slave device 111 Blink Frequency: {(25.0 MHz/(1023 + 1))/2}/512 = 23.84185 Hz
    slave device 112 Blink Frequency: {(25.0 MHz/(1326 + 1))/2}/512 = 23.91731 Hz
    slave device 113 Blink Frequency: {(17.5 MHz/(712 + 1))/2}/512 = 23.96892 Hz
If the user wants all LEDs to blink at a 1.00 Hz rate, the new Blink Rates are:
    slave device 111 Blink Rate: (23 + 1)/23.84185 Hz = 1.00663 seconds
    slave device 112 Blink Rate: (23 + 1)/23.91731 Hz = 1.00346 seconds
    slave device 113 Blink Rate: (23 + 1)/23.96892 Hz = 1.00130 seconds The blink rates are not exact, so the I²C Bus master device 110 should periodically send the RESET PRESCALE general call command to restart all of the prescale counters in slave devices 111-113 at zero. This will resynchronize and restart all of the prescale counters at the same time.

Over time, the respective oscillators in slave devices 111-113 will independently drift in frequency, e.g., due to temperature differences and other factors. The calibration method can be used at any time to re-calibrate and reset the starting times so they all fall back into step.

FIG. 7 illustrates a master device 700 in an embodiment for use on the I²C Bus, and is equivalent to master device 110 in FIG. 1. Master device 700 has a controller 702 that is able to issue a MEASURE PULSE and a RESET PRESCALE pair of general call commands on a standardized I²C Bus. The MEASURE PULSE command requests corresponding slave devices to return a measurement factor related to their local, otherwise private oscillator. The RESET PRESCALE command tells the corresponding slave devices to accept a prescale factor that follows that has been specifically calculated for it to normalize its local private oscillator with a prescale correction. A calculator 704 computes the measurements 706 gathered and computes an appropriate prescale factor 708 for each of many slave devices which will harmonize their collective operation. An initial calibration trigger 710 provides the first impetus for all of the slave devices to have their oscillators normalized to the same frequency, or nearly the same frequency as the digital granularity allows. A periodic calibration trigger 712 is used to keep long-term drift of the individual slave device oscillators under control, it can also be used to re-zero the starting points of the dividers when their respective digital granularity has caused less-than-ideal division quotients to be loaded as prescale factors.

FIG. 8 illustrates a slave device 800 in an embodiment for use on the I²C Bus, and is equivalent to any of slave devices 111-113 in FIG. 1. Slave device 800 has a controller 802 that is able to respond to a MEASURE PULSE and a RESET PRESCALE pair of general call commands from a standardized I²C Bus. A local on-board oscillator 804 produces a raw frequency output 806 that is free-running and that can vary from slave device-to-slave device due to component and temperatures variations. A programmable prescaler 808 allows this raw frequency to be prescaled into a corrected frequency output 810. The programmable prescaler 808 is similar to prescaler 600 shown in FIG. 6.

Ideally, a group of slave devices 800 on the same I²C Bus can have their oscillators collectively corrected by appropriate prescaling so that their respective corrected frequency outputs 810 all match one another. A programmable divider 812 allows application programs to control the frequency, pulse-width, or one-shot time of a final output 814. A measurement circuit 816 is similar to circuit 300 in FIG. 3. It takes a sample of the raw frequency output 806 according to measurement windows controlled by an I²C Bus SDA data line signal 818 and an SCL clock line signal 820. A measurement 822 is output and forwarded by the slave device controller 802 to a master device when it receives a MEASURE PULSE command.

FIG. 9 illustrates a master device embodiment of a method 900 for issuing MEASURE PULSE commands to collect oscillator measurements from a plurality of slave devices, for computing appropriate prescale factors, and for issuing RESET PRESCALE commands to write the computed prescale factors to respective slave devices on an I²C Bus. The bit-structures can be like those of FIGS. 2 and 5, respectively. A step 902 is an initial calibration trigger that gets the loop started the first time, e.g., after a power up reset. A step 904 issues a general call command, MEASURE PULSE, to the I²C Bus. A responsible slave device will respond with an acknowledgement and a measurement of its own raw oscillator frequency. That measurement is received in a step 906 and used in the computing of an appropriate prescale factor in step 908. Once the computed prescale factor is ready, a step 910 issues a general call command, RESET PRESCALE, to the I²C Bus. The next one or two bytes sent in a step 912 are data with the prescale factor, e.g., 10-bits wide. The process is repeated for all of the slave devices that need to have their oscillators harmonized, and different methods of broadcast and collection can be used apart from the ones described in particular here. A periodic calibration trigger 914 repeats the process every so often to keep constituent oscillator drift under control.

FIG. 10 illustrates a slave device embodiment of a method 1000 for responding to MEASURE PULSE commands from a master device wanting to collect oscillator measurements from a plurality of slave devices. Method 1000 also provides for accepting appropriate prescale factors when it receives a RESET PRESCALE command on an I²C Bus. The bit-structures can be like those of FIGS. 2 and 5, respectively. A step 1002 receives a general call command, MEASURE PULSE, on the I²C Bus. The slave device will respond by collecting a measurement in step 1002, e.g., using the circuitry of FIG. 3. That measurement is sent in a step 1006 and used by the master device in the computing of an appropriate prescale factor. Once the computed prescale factor is ready, a step 1008 receives a general call command, RESET PRESCALE, from the I²C Bus. The next one or two bytes are the data with the prescale factor, e.g., 10-bits wide. A step 1010 resets the prescale divider, and a step 1012 loads the programmable prescale divider, e.g., using the circuits of FIG. 6. The slave device now has its oscillator harmonized with the other oscillators on the other slave devices in the system.

In an alternative embodiment, the individual slave devices could be triggered by a master device to reset and cause a recalculation of their own prescale correction factors. This would be similar to a broadcast group reset. The slave devices described here all have the capability to return a measurement of their own oscillators in terms of signals they all see in common on the SDA data line and SCL clock lines of the I²C Bus they share. If they all had a common nominal target frequency to shoot for at the output of the prescaler divider, the slave devices could compute the appropriate prescale factors needed for themselves without having to put any of that traffic on the I²C Bus.

In general, method, protocol, device, and system embodiments act to harmonize the oscillator frequencies of a plurality of I²C Bus slave devices sharing a particular I²C Bus. The raw operating frequency of an oscillator associated with each I²C Bus slave device is measured in terms of a measurement window period provided by an SDA data line and an SCL clock line included in the particular I²C Bus. A prescale factor is calculated from the measurement obtained. The prescale factor is loaded into a programmable prescale divider associated with an oscillator providing the raw operating frequency. The measuring, calculating, and loading are conducted for a plurality of slave devices on the particular I²C Bus to harmonize the respective output frequencies of each programmable prescale divider.

Although specific embodiments of the invention have been described and illustrated, the invention is not to be limited to the specific forms or arrangements of parts as described and illustrated herein. The invention is limited only by the claims.

What is claimed is:

1. A method for harmonizing after-prescaled oscillator frequencies of a plurality of I²C Bus slave devices, comprising:

measuring a raw operating frequency of each oscillator on an I²C Bus slave device in terms of a measurement window period provided by a serial data line and a serial clock line included in a I²C Bus;

calculating a prescale factor using the raw operating frequency obtained in the step of measuring; and loading said prescale factor into a corresponding programmable prescale divider associated with an oscillator providing said raw operating frequency;

wherein, the measuring, calculating, and loading when conducted for a plurality of slave devices on said I²C Bus results in a harmonization of the respective output frequencies of a respective programmable prescale divider.

2. The method of claim 1, further comprising:
sending a MEASURE PULSE general call command over said I²C Bus from a master device to each said slave device to trigger the step of measuring.

3. The method of claim 1, further comprising:
receiving said measurement over said I²C Bus into a master device that executes the step of calculating.

4. The method of claim 1, further comprising:
sending a RESET PRESCALE general call command over said I²C Bus from a master device to each said slave device to initiate the step of loading.

5. The method of claim 1, further comprising:
sending a MEASURE PULSE general call command over said I²C Bus from a master device to each said slave device to trigger the step of measuring;
receiving said measurement over said I²C Bus into a master device that executes the step of calculating; and
sending a RESET PRESCALE general call command over said I²C Bus from a master device to each said slave device to initiate the step of loading.

6. An I²C Bus device, comprising:
a master device controller for issuing two general call commands, MEASURE PULSE and RESET PRESCALE, onto an I²C Bus;
a computer for calculating an oscillator prescale factor for a slave device from a pulse measurement obtained in response to said MEASURE PULSE command; and
a transmitter for sending said oscillator prescale factor to said slave device using said RESET PRESCALE command.

7. The I²C Bus device of claim 6, further comprising:
an initial calibration trigger providing for a first issuance of said MEASURE PULSE command and RESET PRESCALE command.

8. The I²C Bus device of claim 6, further comprising:
a periodic calibration trigger providing for a periodic issuance of said MEASURE PULSE command and RESET PRESCALE command.

9. The I²C Bus device of claim 6, further comprising:
a slave device controller for responding to two said general call commands, MEASURE PULSE and RESET PRESCALE, over said I²C Bus;
a measurement circuit for taking a measurement of the operating frequency of an oscillator private to the slave device with reference to a serial data line and a serial clock line of said I²C Bus; and
a programmable prescaler for accepting said oscillator prescale factor and loading said oscillator prescale factor in a prescale register;
wherein, appropriate oscillator prescale factors when provided to each slave device in a group resident on said I²C Bus will harmonize the after-prescaled frequencies of all of the local oscillators on the slave devices in the group.

10. The I²C Bus device of claim 9, further comprising:
a means for calculating a new oscillator prescale factor for said particular slave device from a pulse measurement obtained in response to said MEASURE PULSE command.

11. The I²C Bus device of claim 9, further comprising:
an oscillator private to the slave device, with a raw frequency output that can be sampled by the measurement circuit, and for feeding the programmable prescaler.

12. The I²C Bus device of claim 11, further comprising:
a programmable divider with an input connected to receive a normalized frequency from the programmable prescaler, and having an output signal whose frequency or pulse width can be programmed by an application program.

13. An I²C Bus master device, comprising:
a processor;
a memory for storing executable instructions comprising:
  a MEASURE PULSE command generated by an I²C Bus master device, said MEASURE PULSE command, when executed, provoking an I²C Bus slave device to sample a raw frequency output of an on-board oscillator of said I²C Bus slave device, and to return a measurement of the raw frequency output over the I²C Bus.

14. The I²C Bus master device of claim 13, further comprising:
a process stored in the memory, said process, when executed, calculating an appropriate oscillator prescale factor for said slave device.

15. The I²C Bus master device of claim 13, further comprising:
a RESET PRESCALE command, said RESET PRESCALE command when executed, restarting a programmable prescaler to an on-board oscillator, and loading an appropriate prescale factor in a register of said programmable prescaler;
wherein appropriate oscillator prescale factors when provided to each slave device in a group resident on said I²C Bus will harmonize the after-prescaled frequencies of all of local oscillators on the slave devices in the group.

16. The I²C Bus master device of claim 15, further comprising:
a periodic calibration trigger, when executed, providing for a periodic issuance of said MEASURE PULSE command and RESET PRESCALE command to restart said programmable prescaler.

17. An I²C Bus system, comprising:
a processor;
a memory for storing executable instructions comprising:
  a MEASURE PULSE command generated by an I²C Bus master device, said MEASURE PULSE command, when executed, provoking an I²C Bus slave device to sample a raw frequency output of an on-board oscillator of said I²C Bus slave device, and to return a measurement over the I²C Bus,
  a process, said process, when executed, calculating an appropriate oscillator prescale factor for said slave device, and
  a RESET PRESCALE command, said RESET PRESCALE command, when executed, restarting a programmable prescaler to said on-board oscillator, and loading an appropriate prescale factor in a register of said programmable prescaler;
a master device controller for issuing the two general call commands, MEASURE PULSE and RESET PRESCALE onto an I²C Bus, and including a computer for calculating a new oscillator prescale factor for said slave device from a pulse measurement obtained in response to said MEASURE PULSE command, and including a transmitter for sending oscillator prescale factors to said slave device using said RESET PRESCALE command; and
a slave device controller for responding to said two general call commands, MEASURE PULSE and RESET PRESCALE, over said I²C Bus, and including a measurement circuit for taking a measurement of the operating frequency of said on-board oscillator with reference to an SDA data line and an SCL clock line of said I²C Bus, and including said programmable prescaler for holding said new oscillator prescale factor and loading said oscillator prescale factor in a prescale register.

18. The system of claim 17, wherein appropriate oscillator prescale factors can be provided to each I²C Bus slave device to harmonize the final output frequencies of all on-board oscillators on corresponding said slave devices in the system.

19. The system of claim 17, further comprising:
a plurality of LEDs that are individually and independently driven by particular ones of said slave devices, and that can be controlled on-off or dimmed in unison.

20. The system of claim 17, further comprising:
a periodic calibration trigger providing for a periodic issuance of said MEASURE PULSE command and RESET PRESCALE command to restart said programmable prescaler.

* * * * *